(12) United States Patent
Hong

(10) Patent No.: US 6,284,597 B1
(45) Date of Patent: Sep. 4, 2001

(54) METHOD OF FABRICATING FLASH MEMORY

(75) Inventor: Gary Hong, Hsinchu (TW)

(73) Assignee: United Microelectronics, Corp., Hsinchu (TW)

( * ) Notice: Subject to any disclaimer, the term of this patent is extended or adjusted under 35 U.S.C. 154(b) by 0 days.

(21) Appl. No.: 09/273,067

(22) Filed: Mar. 19, 1999

(30) Foreign Application Priority Data

Jan. 30, 1999 (TW) .................................................. 88101441

(51) Int. Cl.[7] .................................................. H01L 21/336
(52) U.S. Cl. .......................... 438/257; 438/261; 438/275
(58) Field of Search .................................. 438/257, 258, 438/261, 275, 263, 266, 592, 593, 594

(56) References Cited

U.S. PATENT DOCUMENTS

| | | | |
|---|---|---|---|
| 5,516,713 | * | 5/1996 | Hsue et al. .............................. 438/43 |
| 6,060,357 | * | 5/2000 | Lee ....................................... 438/257 |
| 6,180,454 | * | 1/2001 | Chang et al. ........................ 438/257 |

* cited by examiner

*Primary Examiner*—David Nelms
*Assistant Examiner*—Phuc T. Dang
(74) *Attorney, Agent, or Firm*—Jiawei Huang; J.C. Patents

(57) ABSTRACT

A method of fabricating a flash memory is described. First, a shallow trench isolation structure is formed on the substrate, so that the surface of the shallow trench isolation structure is projected above the surface of the substrate. Then, a spacer is formed on the sidewall of the shallow trench isolation structure, which projects above the surface of the substrate. With the spacer serving as a mask, a gate oxide layer not covered by the spacer is etched to expose the substrate. By thermal oxidation, a self-aligned tunneling oxide layer is formed on the exposed substrate. The spacer is then removed. A floating gate is formed on the tunneling oxide layer. In addition, a dielectric layer and a control gate are formed on the floating gate in sequence, thus completing the flash memory structure.

18 Claims, 3 Drawing Sheets

METHOD OF FABRICATING FLASH MEMORY

CROSS-REFERENCE TO RELATED APPLICATION

This application claims the priority benefit of Taiwan application serial no. 88101441, filed Jan. 30, 1999, the full disclosure of which is incorporated herein by reference.

BACKGROUND OF THE INVENTION

1. Field of Invention

The present invention relates to a fabrication method of a flash memory. More particularly, the present invention relates to a method of fabricating an NAND flash memory structure which provides a higher density memory device array.

2. Description of Related Art

A conventional flash memory structure is characterized by a gate structure having two layers. One layer is a floating gate, fabricated from polysilicon for storing charges, and is usually in a floating status without being connected to any other circuits. Another layer is a control gate for controlling the date access to the floating gate. For example, in a NAND flash memory, each floating gate of the flash memory is connected to a word line (W/L) and each source/drain region of the flash memory is connected in series to a bit line (B/L). Flash memory is a very popular Erasable Programmable Read-Only Memory (EPROM) which can provide faster programming and erasing. Conventionally, the read/write function of the flash memory is performed using Fowler-Nordheim tunneling between the floating gate and the doped region, the rate of which depends on the electron transmission speed between the floating gate and the doped region.

Manufacturing flash memory at a minimized size is necessary in semiconductor process; i.e. the distribution of flash memory needs to have a higher density in order to conform to the process requirements. But, in this case, the extent to minimize the size of the flash memory is limited, if the flash memory conforms to the design rule. Moreover, it is very difficult to fabricate a tunneling oxide layer between the floating gate and the substrate when the thickness of the tunneling oxide layer is required to be very thin. It is especially difficult to perform the alignment step. It is important to precisely conform to the Shallow Trench Isolation (STI) process, so that the unnecessary shorts and leakage resulting between the device and the substrate are prevented.

SUMMARY OF THE INVENTION

The invention provides a method for fabricating an improved flash memory structure. A tunneling oxide layer can be formed as a part of a more precise flash memory structure using a self-aligned method that conforms to STI process steps. It is appropriate to use in a high density memory device array.

In the invention, a method for fabricating a flash memory is provided with following steps. A substrate is provided with a pad oxide layer and a first insulating layer sequentially formed thereon. A photolithography and etching process is performed to expose a part of the pad oxide layer, wherein the substrate covered by the remaining first insulating layer is defined as an active region. With the first insulating layer serving as a mask, the pad oxide layer and the semiconductor substrate are etched to form a trench in the semiconductor. The trench is filled with a plug which serves as a shallow trench isolation. The surface of the plug is approximately levelled with the surface of the first insulating layer. The first insulating layer and the pad oxide layer are removed, so that the surface of the plug is projected above the substrate. A gate oxide layer is formed on the substrate. Spacer is formed on a sidewall of the plug projecting above the surface of the substrate. With the spacer serving as a mask, the gate oxide layer uncovered by the spacer is removed by etching while a part of the plug is also removed, so that the surface of the plug is lowered to some extent. Then, with the spacer and the plug serving as a mask, a self-aligned tunneling oxide layer is formed by thermal oxidation on the exposed substrate, and the spacer is removed thereafter. In addition, the floating gate is formed on the tunneling oxide layer, the gate oxide layer and a part of the plug. A dielectric layer and a control gate are formed in sequence on the floating oxide layer and the exposed plug, so that the flash memory structure is complete.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
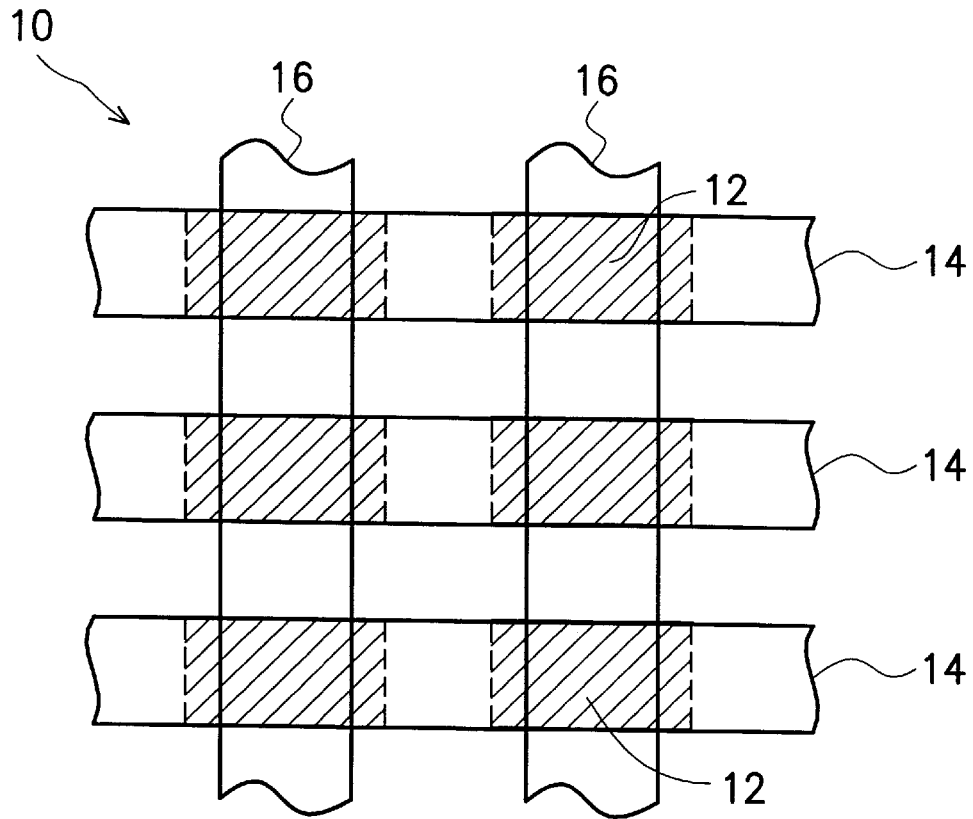
FIG. 1 is a schematic diagram showing the top view of a NAND flash memory structure according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

Using a self-aligned method that conforms to the STI process, the invention provides a method of fabricating an NAND flash memory structure with an improved tunneling oxide layer. A flash memory structure can be formed with more precisely aligned steps and higher coupling efficiency than the prior art, and a memory device array of higher density is made.

FIG. 1 is a schematic diagram showing a top view of an NAND flash memory structure according to one preferred embodiment of this invention. A floating gate 12 (also known as poly 1) lies on a substrate. An array of control gates 14 (also known as poly 2) are formed to cover the floating gate 12 and to serve as a W/L. Typically, the control gates 14 are in a strip shape extending parallel to each other. Bit lines 16 are formed over and perpendicular to the control gates 14. The bit lines are connected in series to the source and drain region (not shown) of each flash memory cell.

FIGS. 2A to 2H are schematic, cross-sectional diagrams showing the fabricating process flow of the flash memory according to one preferred embodiment of this invention. A substrate 20 is provided with the pad oxide layer 22 and the first insulating layer 24 formed in sequence thereon. Preferably, the first insulating layer is formed of silicon nitride by the chemical vapor deposition (CVD) to a thickness of approximately 200–2000 Å. A photolithography and anisotropic etching step is performed to form a photoresist layer 26 on the first insulating layer 24. The first insulating layer 24 is etched to expose a part of the pad oxide layer 22, wherein the substrate covered by the remaining first insulating layer is defined as an active region.

Figure 2A:
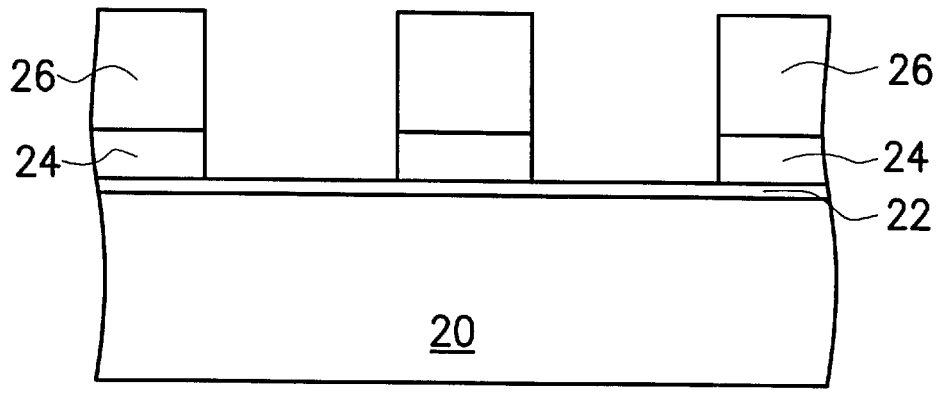
FIGS. 2A to 2H are schematic, cross-sectional diagrams showing the process flow for fabricating the flash memory structure according to one preferred embodiment of this invention.
Figure 2B:
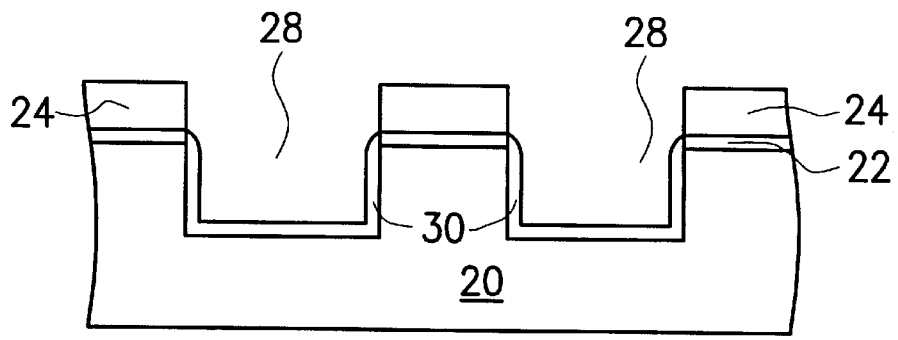

In FIG. 2B, using the first insulating layer 24 as a mask, the pad oxide 22 and the substrate 20 are etched to form a trench 28 in the substrate 20. A thin layer of liner oxide layer 30 is formed by, for example, thermal oxidation in the trench 28.

Figure 2C:
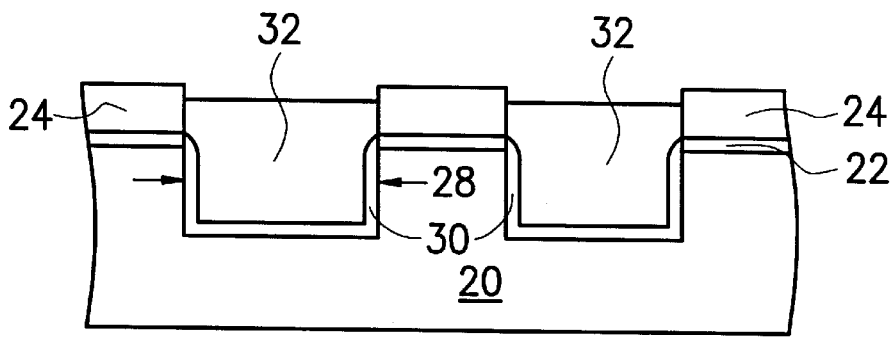

In FIG. 2C, the trench 28 is filled with a plug 32. Preferably, a second insulating layer, for example a silicon oxide layer is formed by CVD to fill the trench 28 over the substrate 22. A polishing step such as a chemical mechanical polishing (CMP) step or an etch back step is performed to form the plug 32. The surface of the plug 32, which is used for STI, has a surface level similar to that of the first insulating layer 24.

Figure 2D:
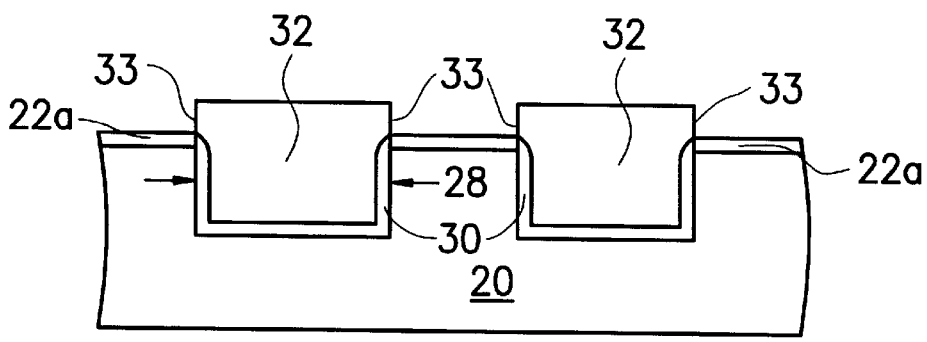

In FIG. 2D, an etching, such as wet or dry etching is performed to remove the first insulating layer 24 and the pad oxide layer 22. This enables the surface of the plug 32 to be projected above the substrate 20. As a consequence, the plug 32 has a sidewall 33 as shown in FIG. 2D. A gate oxide layer 22a is formed by thermal oxidation on the substrate 20.

Figure 2E:
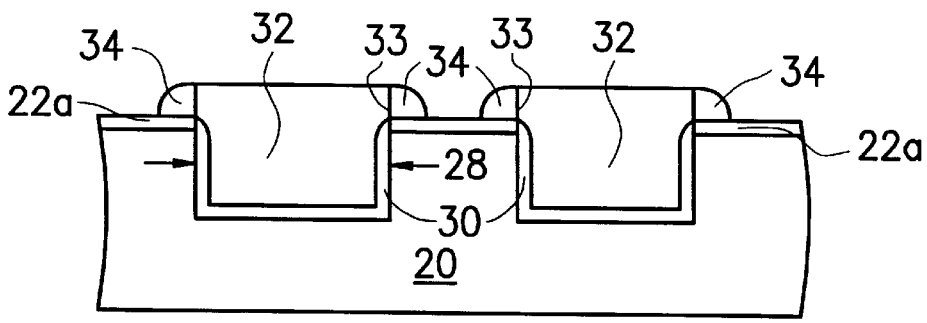

In FIG. 2E, a spacer 34 is formed on the sidewall 33 of the plug 32. A material is selected for the spacer 34 to have a different etch ratio from the underlying gate oxide layer 22a and the plug 32. For example, a SiN layer is used in this embodiment. Preferably, the method of fabricating the spacer 34 is to deposit the silicon nitride layer to a thickness of about 100–1000 Å. Then, with the gate oxide layer 22a serving as the stop layer, the silicon nitride layer is anisotropically etched back. Accordingly, the spacer 34 is formed on the sidewall 33.

Figure 2F:
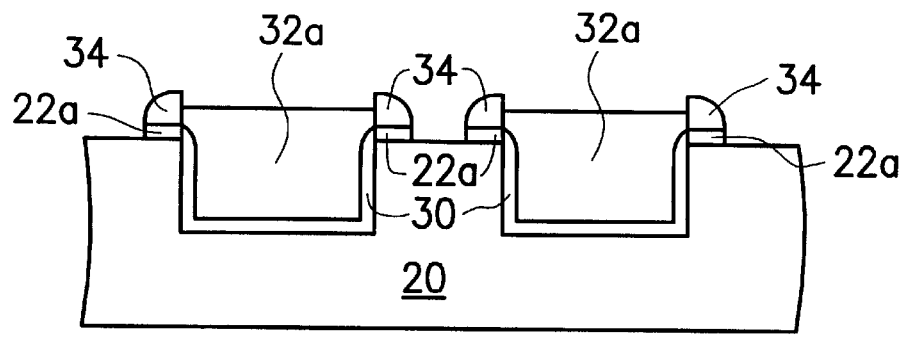

In FIG. 2F, the part of the gate oxide layer 22a uncovered by the spacer 34 is removed by anisotropic etching. Here, a portion of the plug can be removed to form a plug 32a with a lower surface, while still higher than that of the substrate 20.

Figure 2G:
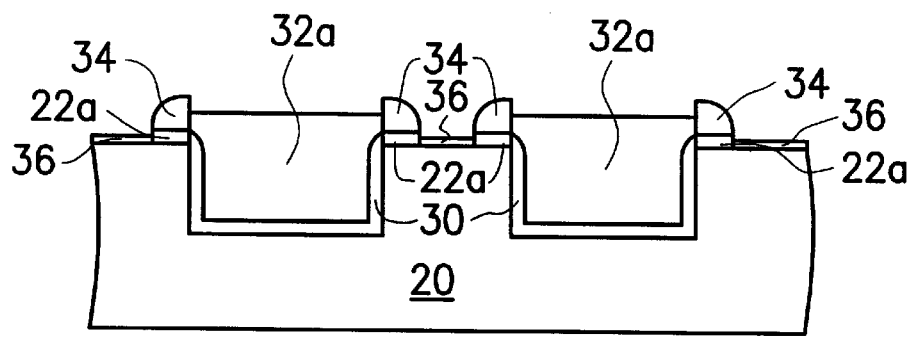

In FIG. 2G, with the spacer 34 and the plug 32a serving as a mask, a self-aligned tunneling oxide layer 36 is formed on the exposed substrate 20 by a thermal process. Preferably, the tunneling oxide layer 36 is formed by thermal oxidation to a thickness of about 50–100 Å. The silicon reacts with oxygen at a high temperature and thus silicon dioxide is grown on the semiconductor substrate 20.

Figure 2H:
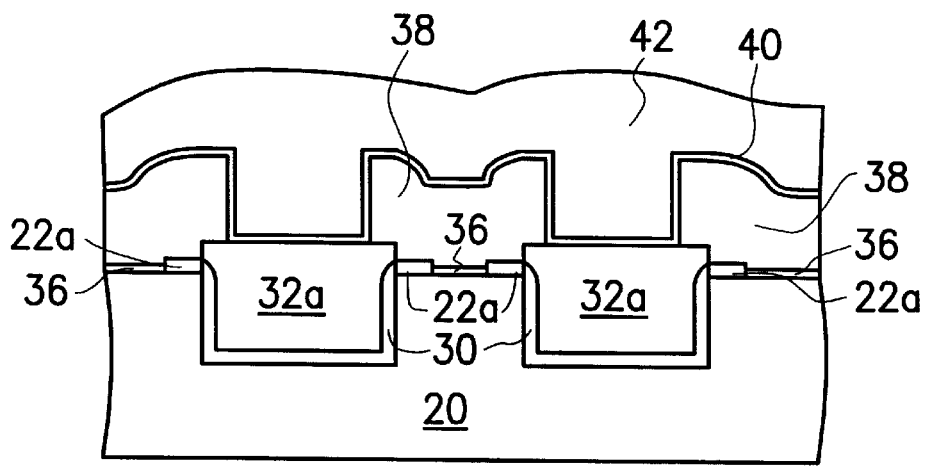

FIG. 2H, the spacer 34 is removed by wet etching, dry etching, or dipping the whole semiconductor substrate in phosphoric acid. A floating gate 38 is formed on the tunneling oxide layer 36, the gate oxide layer 22a, and a part of the plug 32. Preferably, the material for the floating gate is polysilicon, formed by CVD and doping to deposit a polysilicon layer to a thickness of about 500–2000 Å. A photolithography and etching step is performed to define the pattern and to form the floating gate 38. A thin dielectric layer 40 is formed on the floating gate 38 and the exposed plug 32. Preferably, the material for the dielectric layer 40 is oxide/nitride/oxide (ONO). The control gate 42 is formed sequentially on the dielectric layer 40. Preferably, the material for the control gate 42 is also a doped polysilicon layer. Thus, the flash memory of the invention is complete. To summarize the above, the invention provides a method of fabricating a flash memory, having the following characteristics:

(1) The invention provides a fabricating method to improve the tunneling oxide layer for a NAND flash memory.

(2) Using self-alignment that conforms to the STI process steps, the invention can form a flash memory with a more precise aligned step than the prior art.

(3) The invention can manufacture a flash memory with a higher coupling efficiency than the prior art, and it is appropriate to use in a high-density memory device array.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabricating method for an NAND flash memory formed on a substrate, comprising the steps of:

forming a pad oxide layer and a first insulating layer in sequence on the substrate;

performing a photolithography and etching step on the first insulating layer to expose a part of the pad oxide layer;

with the first insulating layer serving as a mask, the pad oxide layer and the substrate are etched to form a trench in the substrate;

filling the trench with a plug having a surface leveled to that of the first insulating layer, wherein the plug serves as a shallow trench isolation;

removing the first insulating layer and the pad oxide layer, so that the surface of the plug is projected above the substrate and a sidewall of the plug is exposed above the substrate;

forming a gate oxide layer on the exposed substrate;

forming a spacer on the sidewall of the plug exposed above the substrate, so that a part of the gate oxide layer around the plug is covered by the spacer;

etching the gate oxide layer uncovered by the spacer;

with the spacer and the plug serving as the mask, forming a self-aligned tunneling oxide layer on the exposed substrate;

etching the spacer to expose the sidewall of the plug;

forming a floating gate on the tunneling oxide layer;

forming a dielectric layer on the floating gate and the exposed plug; and forming a control gate on the dielectric layer.

2. The method of claim 1, further comprising forming a liner oxide layer in the trench.

3. The method of claim 1, wherein the first insulating layer includes a silicon nitride layer.

4. The method of claim 1, wherein the plug includes a silicon oxide plug.

5. The method of claim 1, wherein the spacer includes a silicon nitride spacer.

6. The method of claim 1, wherein the spacer is etched by dipping the whole substrate in phosphoric acid.

7. The method of claim 1, wherein the dielectric layer includes an oxide/nitride/oxide (ONO) layer.

8. The method of claim 1, wherein the floating gate includes a doped polysilicon layer.

9. The method of claim 1, wherein the control gate includes a doped polysilicon layer.

10. A fabricating method for a flash memory, comprising the steps of:

provinding a substrate having a shallow trench isolation, wherein the shallow trench isolation has a top surface and a sidewall exposed above the substrate;

forming a gate oxide layer on the substrate;

forming a spacer on the sidewall of the shallow trench isolation, so that the spacer covers a part of the gate oxide;

etching the gate oxide layer uncovered by the spacer to expose the substrate between spacers;

with the spacer and the plug serving as a mask, forming a self-aligned tunneling oxide layer on the exposed substrate;

removing the spacer;

forming a floating gate on the tunneling oxide layer;

forming a dielectric layer on the floating gate and the exposed plug; and forming a control gate on the dielectric layer, wherein the control gate extends perpendicular to a direction which the shallow trench isolation extends along.

11. The method of claim 10, further comprising forming a liner oxide layer in the trench.

12. The method of claim 10, wherein the first insulating layer includes a silicon nitride layer.

13. The method of claim 10, wherein the plug includes a silicon oxide plug.

14. The method of claim 10, wherein the spacer includes a silicon nitride spacer.

15. The method of claim 10, wherein the spacer is removed by dipping the whole substrate in phosphoric acid.

16. The method of claim 10, wherein the dielectric layer includes an oxide/nitride/oxide (ONO) layer.

17. The method of claim 10, wherein the floating gate includes a doped polysilicon layer.

18. The method of claim 10, wherein the control gate includes a doped polysilicon layer.

* * * * *